United States Patent
Iwase et al.

(10) Patent No.: US 9,198,298 B2
(45) Date of Patent: Nov. 24, 2015

(54) METHOD FOR MANUFACTURING TRANSPARENT PRINTED CIRCUIT AND METHOD FOR MANUFACTURING TRANSPARENT TOUCH PANEL

(75) Inventors: Masayuki Iwase, Tsukubamirai (JP); Kazuyuki Ozaki, Hiratsuka (JP)

(73) Assignee: NIPPON MEKTRON, LTD., Tokyo-To (JP)

( * ) Notice: Subject to any disclaimer, the term of this patent is extended or adjusted under 35 U.S.C. 154(b) by 0 days.

(21) Appl. No.: 13/697,173

(22) PCT Filed: Dec. 19, 2011

(86) PCT No.: PCT/JP2011/079372
§ 371 (c)(1),
(2), (4) Date: Nov. 9, 2012

(87) PCT Pub. No.: WO2012/147235
PCT Pub. Date: Nov. 1, 2012

(65) Prior Publication Data
US 2013/0056440 A1    Mar. 7, 2013

(30) Foreign Application Priority Data

Apr. 26, 2011    (JP) ................. 2011-098543

(51) Int. Cl.
| | |
|---|---|
| *H01B 13/00* | (2006.01) |
| *B44C 1/22* | (2006.01) |
| *C03C 15/00* | (2006.01) |
| *C03C 25/68* | (2006.01) |
| *C23F 1/00* | (2006.01) |

(Continued)

(52) U.S. Cl.
CPC ............ *H05K 3/061* (2013.01); *H01L 21/0273* (2013.01); *H01L 31/1016* (2013.01); *H01L 31/1888* (2013.01); *H01L 33/42* (2013.01); *H05K 1/09* (2013.01); *H01L 31/1884* (2013.01); *H05K 1/03* (2013.01); *H05K 2201/0108* (2013.01); *H05K 2201/0329* (2013.01); *H05K 2203/0264* (2013.01)

(58) Field of Classification Search
None
See application file for complete search history.

(56) References Cited

U.S. PATENT DOCUMENTS

| | | | |
|---|---|---|---|
| 2004/0129978 A1 | 7/2004 | Hirai | |
| 2009/0039351 A1* | 2/2009 | Kobayashi et al. | ............. 257/59 |

FOREIGN PATENT DOCUMENTS

| | | | | |
|---|---|---|---|---|
| EP | 1434281 A2 | 6/2004 | | |
| JP | 06-302509 | * 10/1994 | ............ | H01L 21/027 |

(Continued)

OTHER PUBLICATIONS

Chinese Office Action issued on Sep. 19, 2014, to a corresponding Chinese Patent Application No. 201180022940.5.

(Continued)

*Primary Examiner* — Stephanie Duclair
(74) *Attorney, Agent, or Firm* — Jacobson Holman, PLLC.

(57) ABSTRACT

To peel an etching resist easily and reliably without damaging a transparent conductive layer coated with the etching resist. A method for manufacturing a transparent printed circuit in an embodiment of the present invention includes: providing a transparent conductive sheet 3 having a transparent base material 1 and a transparent conductive layer 2 formed on the transparent base material 1, forming an etching resist 4 having a specified pattern on the transparent conductive layer 2, etching the transparent conductive layer 2 with the etching resist 4 as a mask, forming a peeling film 5 on the etching resist 4 and on the transparent base material 1 exposed by etching of the transparent conductive layer 2 so as to cover an area where the etching resist 4 is formed, and peeling the peeling film 5 together with the etching resist 4.

16 Claims, 8 Drawing Sheets

(51) Int. Cl.
*H01L 21/44* (2006.01)
*H01L 21/302* (2006.01)
*H01L 21/461* (2006.01)
*H05K 3/06* (2006.01)
*H01L 21/027* (2006.01)
*H01L 33/42* (2010.01)
*H01L 31/101* (2006.01)
*H05K 1/09* (2006.01)
*H01L 31/18* (2006.01)
*H05K 1/03* (2006.01)

(56) References Cited

FOREIGN PATENT DOCUMENTS

| JP | 09-034133 | * | 2/1997 | ................ G03F 7/42 |
| JP | 2009-205924 | * | 9/2009 | ............... H01B 5/14 |
| JP | 2009-258935 | | 11/2009 | |
| JP | 2009-283410 | | 12/2009 | |
| JP | 2010-238052 | * | 10/2010 | ............. G06F 3/041 |
| JP | 2010-262529 | | 11/2010 | |
| JP | 2010-267223 | | 11/2010 | |
| JP | 2011-018885 | | 1/2011 | |
| WO | 03/001299 | * | 1/2003 | ............ G03F 7/0004 |
| WO | 2008/046058 | | 4/2008 | |

OTHER PUBLICATIONS

The extended European search report issued on Oct. 6, 2014, to a corresponding European patent application.

The office action mailed on Jan. 6, 2015, to a corresponding Japanese patent application.

* cited by examiner

METHOD FOR MANUFACTURING TRANSPARENT PRINTED CIRCUIT AND METHOD FOR MANUFACTURING TRANSPARENT TOUCH PANEL

This is a national stage of PCT/JP11/079372 filed Dec. 19, 2011 and published in Japanese which claims the priority of Japanese number 2011-098543 filed Apr. 26, 2011, hereby incorporated by reference.

TECHNICAL FIELD

The present invention relates to a method for manufacturing a transparent printed circuit and a method for manufacturing a transparent touch panel.

BACKGROUND ART

Transparent printed circuits are fabricated from transparent conductive sheets, which have a transparent base material and a transparent conductive layer formed on the transparent base material, through some processes such as etching or otherwise processing the transparent conductive layer into a desired pattern to form a transparent conductive pattern.

Existing general transparent touch panels are mainly fabricated with ITO (Indium Tin Oxide) transparent conductive sheets having an ITO thin film layer formed on the surface of a transparent base material (see Patent Literature 1).

More specifically, the ITO transparent conductive sheets have an ITO thin film layer formed on a sheet-like or film-like transparent base material, the transparent base material being made of glass or plastic such as polyethylene terephthalate (PET) by sputtering. The ITO thin film layer is etched or otherwise processed into a specified pattern so that a transparent conductive pattern is obtained.

However, due to recent diffusion of smart phones with a built-in transparent touch panel, the demand for the transparent touch panels made of ITO is growing. This makes it difficult to procure ITO transparent conductive sheets.

Moreover, the ITO transparent conductive sheets are costly in terms not only of the material, or ITO, itself, but also of production efficiency because the ITO thin film layer is formed by a sputtering technique. Further, another problem is that since the ITO thin film layer does not have flexibility, it is difficult to process the ITO transparent conductive sheets in a Roll to Roll process. Furthermore, yet another problem is that the transparent printed circuits produced from the ITO transparent conductive sheets cannot withstand a bending process involving small inflection encountered in the stage where the printed circuits are incorporated in or mounted on electronic equipment such as smart phones.

Transparent conductive sheets which can potentially solve the above problems (hereinafter referred to as "conductive polymer-based transparent conductive sheets") are known which have a transparent conductive layer containing an organic transparent conductive polymer (polyethylene dioxythiophene (PEDOT) and the like) formed on the surface of a transparent base material (see Patent Literature 2).

There are also known nanowire-based transparent conductive sheets which have a transparent conductive layer containing a metal nanowire formed thereon (see Patent Literature 3). The transparent conductive layer of the nanowire-based transparent conductive sheets is made of a nanowire-containing transparent conductive material, which is prepared by, for example, dispersing and blending metal (Ag and the like) nanowires (or carbon nanotubes) into an organic resin matrix component. The nanowire-containing transparent conductive material is applied to a transparent base material and dried thereon to form the transparent conductive layer. In this case, the transparent base material is a plastic sheet/film made of polyester, polycarbonate or the like.

There are also known transparent conductive sheets having a combination of the conductive polymer-based transparent conductive sheets and the nanowire-based transparent conductive sheets, i.e., hybrid transparent conductive sheets having a transparent conductive layer formed with a transparent conductive material, which is prepared by dispersing and blending conductive nanowires into an organic transparent conductive polymer (see Patent Literature 4).

The aforementioned conductive polymer-based transparent conductive sheets, nanowire-based transparent conductive sheets, and hybrid transparent conductive sheets are given a generic name of "amorphous transparent conductive sheets."

The amorphous transparent conductive sheets have a transparent conductive layer made of a transparent conductive material containing an organic transparent conductive polymer and/or conductive nanowires. The transparent conductive material is applied onto a transparent base material (PET film and the like) by bar coating or the like and dried thereon to form the transparent conductive layer.

Since the amorphous transparent conductive sheets can be manufactured through dispersing process, applying process, and drying process, the manufacturing cost thereof is lower than that of the ITO transparent conductive sheets which have an ITO thin film layer formed by the sputtering technique. The transparent conductive layer of the amorphous transparent conductive sheets also has an advantage of being flexible. Accordingly, the amorphous transparent conductive sheets are expected to find an application in substrates of optical devices and transparent flexible printed circuits (transparent FPCs).

CITATION LIST

Patent Literature

Patent Literature 1
Japanese Patent Laid-Open No. 2009-258935
Patent Literature 2
Japanese Patent Laid-Open No. 2009-283410
Patent Literature 3
National Publication of International Patent Application No. 2010-507199
Patent Literature 4
Japanese Patent Laid-Open No. 2009-205924

SUMMARY OF INVENTION

Technical Problem

However, it has been conventionally difficult to process the transparent conductive layer of the amorphous transparent conductive sheets into a specified pattern to manufacture transparent printed circuits having transparent wiring patterns. The reasons thereof will be described below.

Since an etching solution for the transparent conductive layer of the amorphous transparent conductive sheets has already been developed, it is possible to etch the transparent conductive layer with an etching resist as a mask. Generally, the etching resists for the transparent conductive layer containing an organic transparent conductive polymer (PEDOT and the like) are formed with dry films for etching-resist formation, etching-resist pastes and the like. The etching resists formed in such a way are peeled off with an alkaline peeling solution (such as caustic soda (sodium hydroxide) solution adjusted to be weakly alkaline) after etching is finished.

However, the organic transparent conductive polymer is low in alkali resistance. Consequently, when the weak alkaline peeling solution is used, characteristic degradation occurs such as degradation in conductivity of the organic transparent conductive polymer. Therefore, existing etching-resist materials cannot be used for the conductive polymer-based transparent conductive sheets.

As for the nanowire-based transparent conductive sheets, it is also possible to form a mask with an existing etching-resist material and to form a pattern on the transparent conductive layer with a dedicated etching solution. However, when the etching resist is peeled off with the alkaline peeling solution, metals in the metal nanowire may possibly react with the peeling solution and discolor. In the case of metal nanowire containing silver as a main component for example, discoloring is notable. The discoloring of the metal nanowire causes failures such as wiring patterns of transparent printed circuits being visualized. Moreover, many fixers (e.g., resin components) for fixing the metal nanowire to the transparent base material do not have sufficient resistance against alkali. Accordingly, problems that may occur is that the fixers may possibly be attacked by the alkaline peeling solution, as a result of which the metal nanowire may be detached from the transparent base material, causing substantial deterioration in conductivity of the transparent conductive layer. Therefore, the existing etching-resist materials cannot be used for the nanowire-based transparent conductive sheets either.

Accordingly, the inventors of the present invention keenly examined a method in which an etching resist is formed with an ink and the like curable by ultraviolet (UV) irradiation or heating, and after etching is performed thereon, the etching resist is mechanically peeled off by using peeling jigs such as tweezers without using alkaline peeling solution at all.

In this method, an end portion of the etching resist is turned over with a jig and the like, and then the etching resist is stripped while the end portion is grasped. However in some cases, when the end portion of the etching resist is stripped, the transparent conductive layer coated with the etching resist may be damaged, which resulted in troubles such as disconnection. These troubles are attributable to the fact that the transparent conductive layer is formed to be extremely thin (about several hundreds nm) for securing high transparency and also to the fact that the transparent conductive layer has a low mechanical strength (surface hardness).

The present invention has been made based on the aforementioned technical understanding, and has as its object to provide a method for manufacturing a transparent printed circuit and a method for manufacturing a transparent touch panel, which can peel an etching resist easily and reliably without damaging a transparent conductive layer coated with the etching resist.

Solution to Problem

A method for manufacturing a transparent printed circuit in one aspect of the present invention includes:
providing a transparent conductive sheet having a transparent base material and a transparent conductive layer formed on the transparent base material;
forming an etching resist having a specified pattern on the transparent conductive layer;
etching the transparent conductive layer with the etching resist as a mask;

forming a peeling film on the etching resist and on the transparent base material exposed by the etching of the transparent conductive layer so as to cover an area where the etching resist is formed; and
peeling the peeling film together with the etching resist.

A method for manufacturing a transparent touch panel in one aspect of the present invention includes:
providing a transparent conductive sheet having a transparent base material, and a first transparent conductive layer and a second transparent conductive layer which are respectively formed on a front surface and a back surface of the transparent base material;
forming a first etching resist having a specified pattern on the first transparent conductive layer;
forming a second etching resist having a specified pattern on the second transparent conductive layer;
etching the first transparent conductive layer with the first etching resist as a mask while etching the second transparent conductive layer with the second etching resist as a mask;
forming a first peeling film on the first etching resist and on the transparent base material exposed by the etching of the first transparent conductive layer so as to cover an area where the first etching resist is formed;
forming a second peeling film on the second etching resist and on the transparent base material exposed by the etching of the second transparent conductive layer so as to cover an area where the second etching resist is formed;
peeling the first peeling film together with the first etching resist to form a first transparent conductive pattern; and
peeling the second peeling film together with the second etching resist to form a second transparent conductive pattern.

Advantageous Effects of the Invention

According to the method for manufacturing the transparent printed circuit of the present invention, peeling a peeling film, which is formed so as to cover an area where an etching resist is formed, achieves peeling of the entire etching resist reliably and easily. This makes it possible to substantially enhance working efficiency and a yield in the process of peeling the etching resist.

BRIEF DESCRIPTION OF DRAWINGS

FIG. 4(a) is a plan view of a front surface of a base material with an etching resist formed thereon, while FIG. 4(b) is a plan view of a back surface of the base material with an etching resist formed thereon.

FIG. 5(a) is a plan view of a front surface of a base material with a peeling film formed thereon, while FIG. 5(b) is a plan view of a back surface of the base material with a peeling film formed thereon.

FIG. 6(a) is a plan view of a front side of the transparent touch panel, while FIG. 6(b) is a plan view of a back side of the transparent touch panel.

DESCRIPTION OF EMBODIMENT

Figure 1:
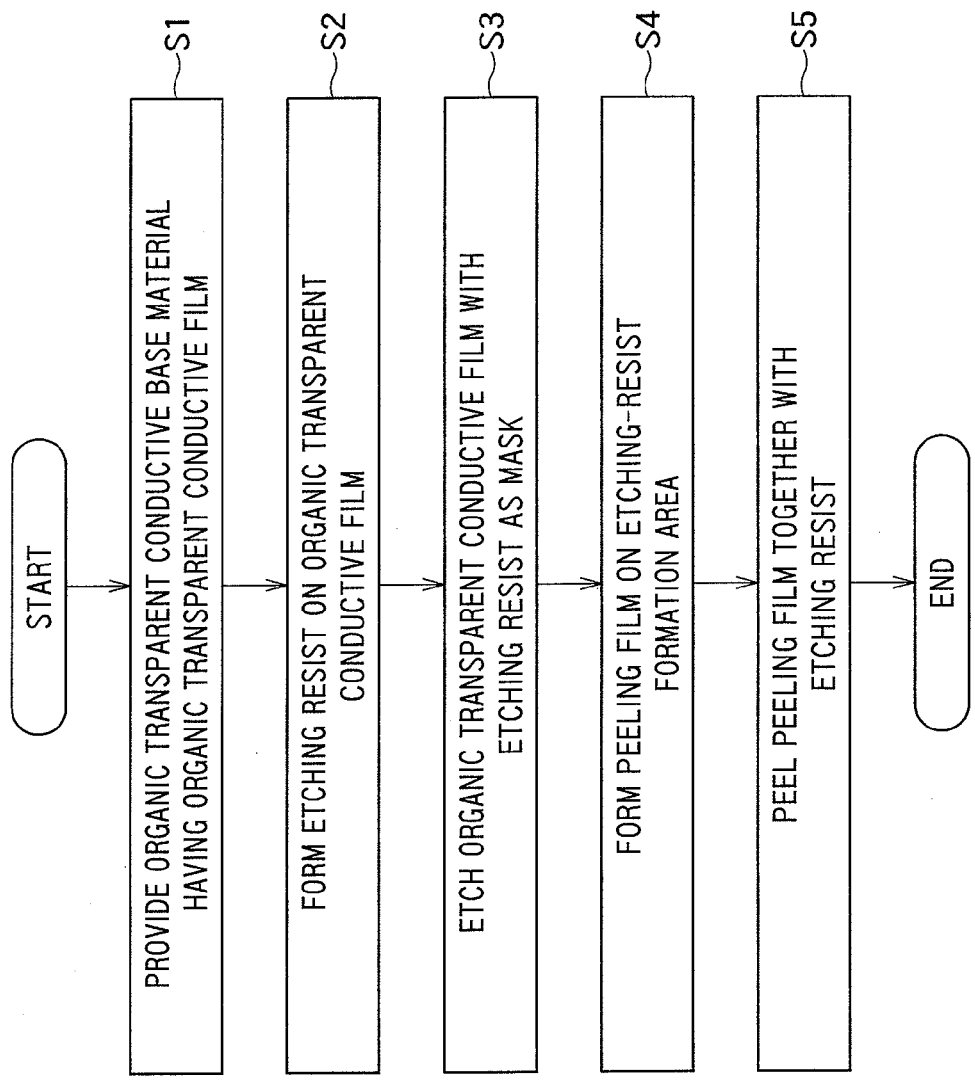
FIG. 1 is a flowchart showing a method for manufacturing a transparent printed circuit according to an embodiment of the present invention.

An embodiment of the present invention will be described hereinbelow with reference to the drawings. It is to be noted that like component members having like functions are designated by like reference signs. Detailed descriptions of the component members with like reference sings will not be repeated. A scale ratio of each component member is suitably changed so that each component has a size recognizable on the drawing.

(Method for Manufacturing Transparent Printed Circuit)

Figure 2:
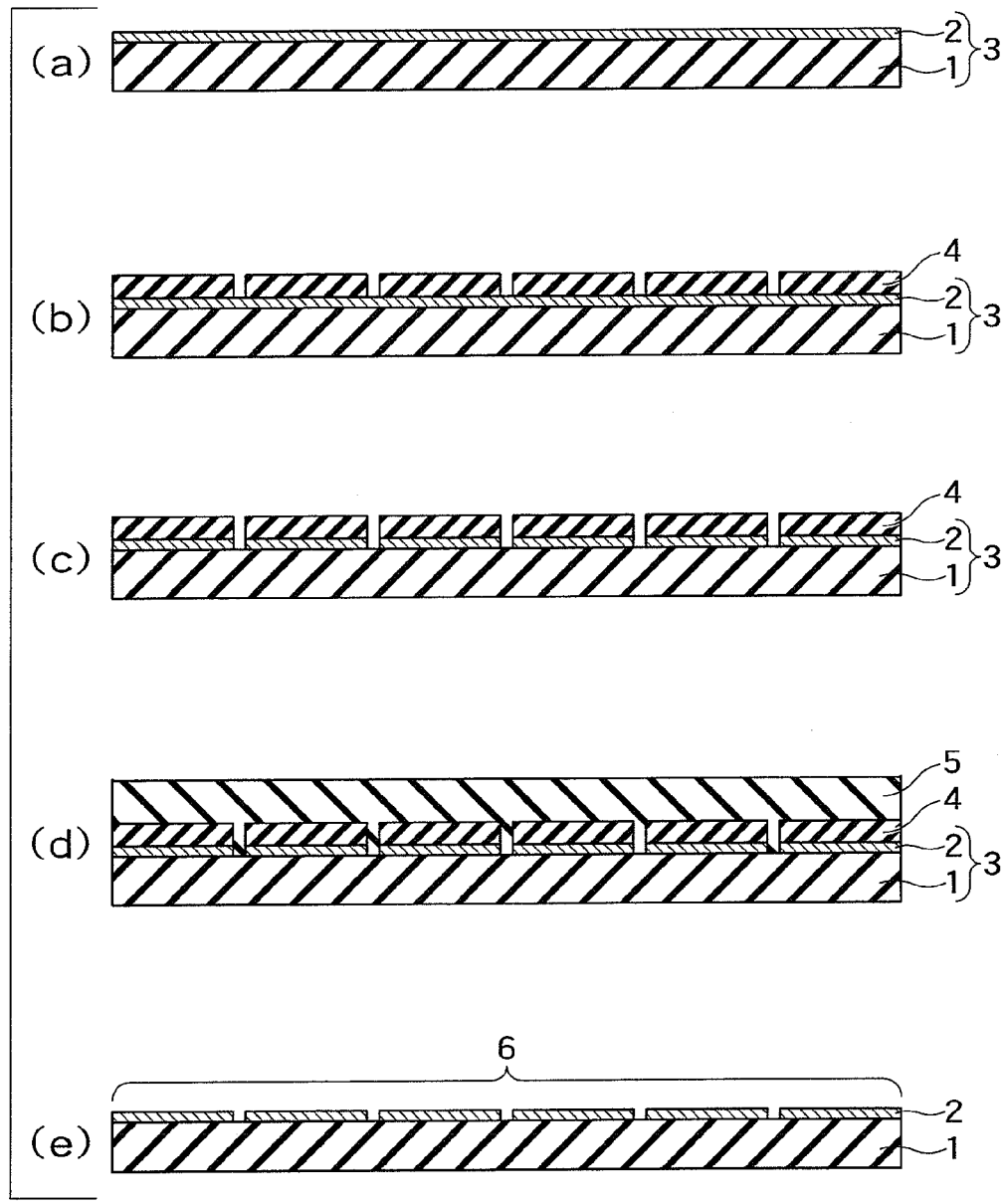
FIG. 2 is a cross sectional process view for explaining the method for manufacturing the transparent printed circuit according to the embodiment of the present invention.
Figure 3:
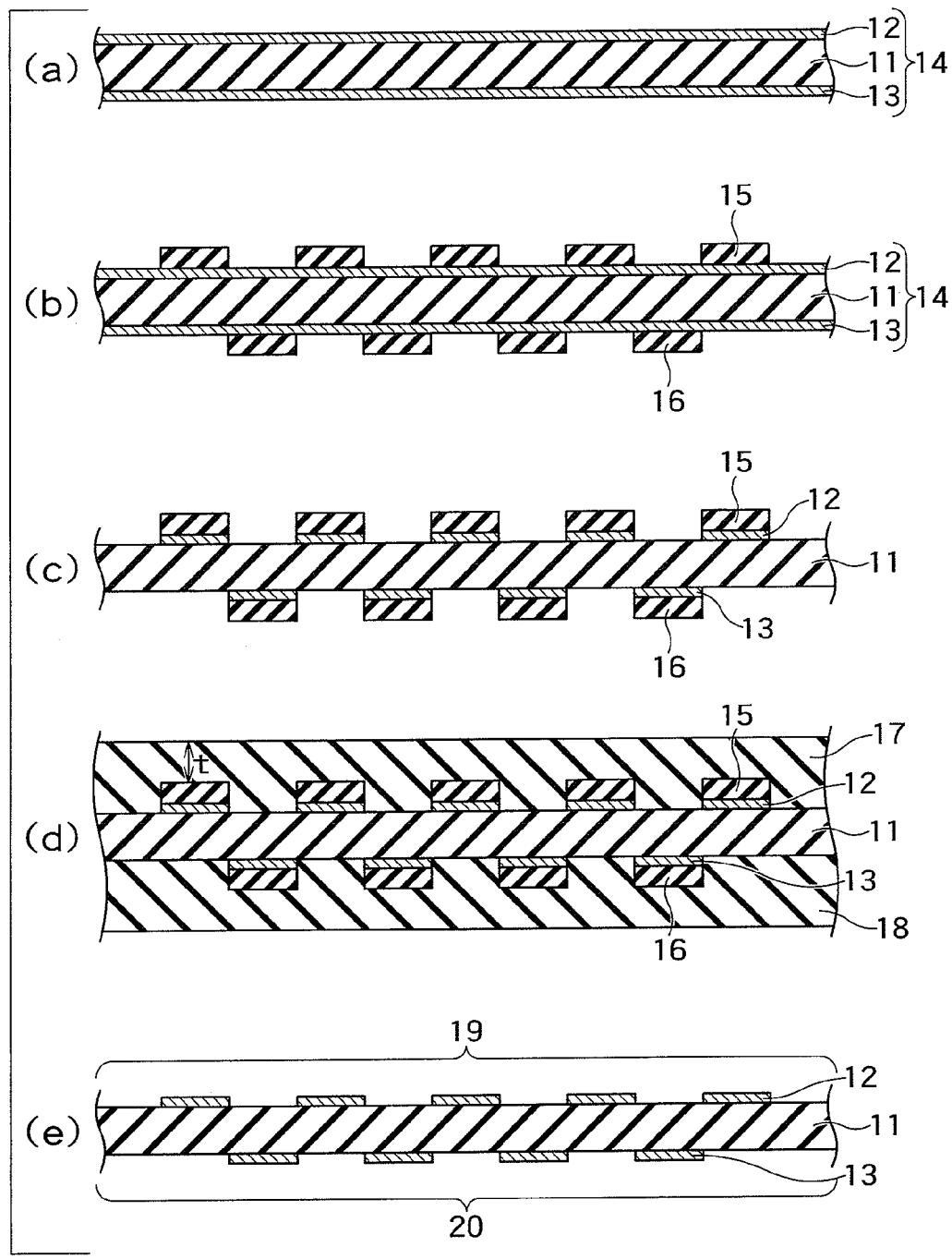
FIG. 3 is a cross sectional process view for explaining a method for manufacturing a transparent touch panel according to the embodiment of the present invention.

First, a description will be given of a method for manufacturing a transparent printed circuit according to the embodiment of the present invention with reference to FIGS. 1 and 2. FIG. 1 is a flowchart showing the method for manufacturing the transparent printed circuit according to the embodiment of the present invention. FIG. 2 shows a cross sectional process view of the manufacturing method.

(1) First, as shown in FIG. 2(a), a transparent conductive sheet 3 is prepared which has a transparent base material 1 and a transparent conductive layer 2 formed by applying a transparent conductive material onto the transparent base material 1 (step S1).

As the material of the transparent base material 1, polyethylene terephthalate (PET), polyethylene naphthalate (PEN), polycarbonate, or transparent polyimide may be used in one example. As the material of the transparent base material 1, a glass film having flexibility may also be used. The transparent base material 1 may have flexibility or may have no flexibility like transparent glass plates. The material of the transparent base material 1 is suitably selected in accordance with applications.

The transparent conductive material applied onto the transparent base material 1 is a material containing an organic transparent conductive polymer and/or a conductive nanowire such as metal nanowires. More specifically, the transparent conductive material is a solution in which an organic transparent conductive polymer (polyethylene dioxythiophene (PEDOT), polypyrrole, poly aniline or the like) is dissolved or a solution in which a metal nanowire and a resin component into solvent are dispersed.

The metal nanowire is made of at least one or more kinds of metals out of iron, cobalt, nickel, copper, zinc, ruthenium, rhodium, palladium, silver, cadmium, osmium, iridium, platinum and gold. The metal nanowire may also be made of an alloy having the above metals as main components and arbitrary additive elements added thereto to obtain desired characteristics. It is to be noted that the metal nanowire is preferably made of silver, platinum, or gold, and is more preferably made of silver in view of conductivity. Moreover, two or more kinds of metal nanowires may be contained in the transparent conductive material.

As the transparent conductive material, a solution may be used in which a carbon nanowire, a carbon nanotube, or graphene is dispersed into solvent together with a resin component.

It is to be noted that the length of the metal nanowire in a minor axis direction is preferably 1 nm or more and 1 μm or less, and is more preferably 1 nm or more and 100 nm or less. This is because transmittance of the transparent conductive layer is lowered when the length in the minor axis direction is too large, and synthesizing of materials becomes difficult when the length is too small. The length of the metal nanowire in a major axis direction is preferably 1 μm or more and 1 mm or less, and is more preferably 1 μm or more and 100 μm or less. This is because conductivity of the transparent conductive layer in the transparent conductive sheet is lowered when the length in the major axis direction is too small, and handling of materials becomes difficult when the length is too large.

It is also possible to use a transparent conductive sheet which is formed by laminating a transfer sheet on the transparent base material, the transfer sheet being formed into a sheet shape by mixing the aforementioned metal nanowire with the resin component. The transfer sheet may be manufactured through manufacturing processes such as a dispersing process, an applying process and a drying process. Since lamination of the transfer sheet onto the transparent base material can be performed with a general laminating device, the manufacturing cost thereof is advantageously lower than that of the ITO transparent conductive sheets.

(2) Next, an etching resist 4 having a specified pattern is formed on the transparent conductive layer 2 as shown in FIG. 2B (step S2).

More specifically, an ultraviolet curable ink (UV ink) is printed on the transparent conductive layer 2 by screen printing. Then, the printed UV ink is cured by irradiation with an ultraviolet ray, by which the etching resist 4 is formed. It is to be noted that using the UV ink provides a manufacturing advantage as the UV ink does not need to use a long drying furnace, which is needed for thermally curable inks.

As the UV ink, those having resistance against an etching solution for the transparent conductive layer 2 are used. As the printing method of the etching resist 4, gravure printing, flexo printing, or ink jet printing may be used.

It is to be noted that the etching resist 4 is desirably formed in a printing method instead of a photofabrication method or a photo lithography method. This is because when the photofabrication method or the photolithography method is used, a wet process needs to be performed for development, and the wet process causes characteristic degradation in the transparent conductive layer. Meanwhile, the printing method offers an advantage that etching-resist patters can directly be formed without performing the wet process for development.

Ultraviolet curable UV inks are generally used as the material of the etching resist. Without being limited thereto, the present invention may use heat curable inks or heat-drying inks. In the case of using heat curable inks, the heat curable ink is printed on the transparent conductive layer 2. Then, the printed ink is cured by heating, so that the etching resist 4 is formed. In the case of using heat-drying inks, the heat-drying ink is printed on the transparent conductive layer 2. Then, the printed ink is dried so that the etching resist 4 is formed. Since neither of the cases involve irradiation of an ultraviolet ray, they are advantageous in the point that ultraviolet degradation in transparent base materials and fixers can be prevented.

(3) Next, as shown in FIG. 2(c), the transparent conductive layer 2 is etched with the etching resist 4 as a mask (step S3).

More specifically, the transparent conductive sheet 3 with the etching resist 4 printed thereon is put in a container filled with the etching solution for the transparent conductive layer. Then, the etching solution is washed away with water and the transparent conductive sheet is dried.

Etching in this step removes the transparent conductive layer 2 and exposes the transparent base material 1 in a part not coated with the etching resist 4.

(4) Next, as shown in FIG. 2(d), a peeling film 5 is formed on the etching resist 4 and on the transparent base material 1 exposed by etching of the transparent conductive layer 2, so as to cover an area (etching-resist formation area) where the etching resist 4 is formed (step S4).

More specifically, an UV ink is printed by screen printing, gravure printing, flexo printing, or bar-coat printing over the entire surface of the area where the etching resist 4 is formed. Then, the printed UV ink is cured by ultraviolet irradiation so that the peeling film 5 is formed. The peeling film 5 may also be formed by printing the heat curable ink or the heat-drying ink over the entire surface of the area where the etching resist 4 is formed and then heating or drying the printed ink.

It is to be noted that the peeling film 5 is preferably formed with a material identical to that of the etching resist 4. Using the identical materials integrates the etching resist 4 and the peeling film 5, which enhances adhesiveness therebetween and achieves easier peeling.

Moreover, since ultraviolet curable materials hardly change their volume between before and after curing, a thicker peeling film can efficiently be formed. As described later, a thicker peeling film 5 is beneficial in view of easiness of peeling. It is desirable, therefore, to form the peeling film 5 with ultraviolet curable materials such as UV inks.

(5) Next, as shown in FIG. 2(e), the peeling film 5 is peeled off together with the etching resist 4 (step S5). More specifically, an end portion of the peeling film 5 is lifted up and the peeling film 5 is stripped off. Accordingly, the peeling film 5 is peeled off together with the etching resist 4. As a result of this step, a transparent conductive pattern 6 formed on the transparent conductive layer processed according to a specified pattern is obtained.

After the transparent conductive pattern 6 is formed, a conductive wiring may be formed on the transparent base material 1 where necessary. The conductive wiring may be formed by, for example, printing conductive pastes by screen printing and by drying or heat-curing the printed pastes. Before the etching resist 4 is formed, the conductive wiring may be formed on the transparent conductive layer 2, and the peeling film 5 may be formed so as to coat the conductive wiring. With this configuration, it becomes possible to protect the conductive wiring and the transparent conductive pattern 6 with the peeling film 5 until the peeling film 5 is peeled off.

In the method for manufacturing the transparent printed circuit in the foregoing description, peeling the peeling film 5, which is formed so as to cover the area where the etching resist 4 is formed, achieves peeling of the entire etching resist 4 reliably and easily. Accordingly, it becomes possible to considerably enhance working efficiency and a yield in the process of peeling the etching resist 4. It also becomes possible to minimize a physical damage exerted on the transparent conductive layer 2 at the time of peeling the etching resist 4. Moreover, since the alkaline resist peeling solution is not used, the transparent conductive layer is free from degradation. Therefore, it becomes possible to process the transparent conductive layer into a specified pattern without exerting not only a physical damage but also a chemical damage.

Moreover, in the method for manufacturing of the transparent printed circuit in the present invention, the transparent conductive layer having flexibility is a processing object. As a consequence, Roll to Roll process can be applied. Further, the transparent conductive sheets obtained by the above manufacturing method can go through a bending process and a molding process which involve small inflection unlike the ITO transparent conductive sheets which had difficulty in withstanding these processes. In addition, since the transparent conductive layer is formed as a thin film of 1 μm or less, a level difference between the transparent conductive pattern 6 and the transparent base material 1 after etching is small. Consequently, when the etching resist 4 and the peeling film 5 are collectively peeled, chances of a film residue remaining at edges of the transparent conductive pattern 6 are low.

Moreover, since peeling can be performed on the peeling film, which has a larger area and a higher film strength than the etching resist, it becomes possible to conduct peeling operation with an automatic machine such as separators. Accordingly, it is not necessary to manually peel the etching resist one by one, so that manufacturing efficiency is substantially enhanced.

(Method for Manufacturing Transparent Touch Panel)

A description is now given of an example of a method for manufacturing a capacitance-operated transparent touch panel based on the method for manufacturing the transparent printed circuit described in the foregoing with reference to FIGS. 3 to 6.

(1) First, as shown in FIG. 3(a), a transparent conductive sheet 14 is prepared which has a transparent base material 11, a transparent conductive layer 12 formed by applying a transparent conductive material to a front surface of the transparent base material 11, and a transparent conductive layer 13 formed by applying a transparent conductive material to a back surface of the transparent base material 11. Here, the transparent conductive materials applied to the front surface and back surface of the transparent base material 11 are, for example, a solution in which an organic transparent conductive polymer is dissolved, or a solution in which dispersing a metal nanowire and a resin component into solvent are dispersed.

Used herein as the transparent conductive sheet 14 is a transparent conductive sheet having a PEDOT ink applied to both sides of a PET film by bar coating and the like. As the transparent conductive sheet 14, a transparent conductive sheet may also be used which is formed by applying a transparent conductive material containing a conductive nanowire to both sides of the transparent base material 11.

(2) Next, as shown in FIGS. 3(b), 4(a) and 4(b), an etching resist 15 and an etching resist 16 each having a specified pattern are formed on the transparent conductive layer 12 and on the transparent conductive layer 13, respectively.

Here, an UV ink is first printed on the transparent conductive layer 12 by screen printing, and then the printed UV ink is cured by irradiation with an ultraviolet ray, so that the etching resist 15 is formed. Next, an UV ink is printed on the transparent conductive layer 13 by screen printing, and then the printed UV ink is cured by irradiation with an ultraviolet ray, so that the etching resist 16 is formed. Used as the UV ink is an UV masking ink (JELCON RIP series) made by Jujo Chemical Co., Ltd, which has resistance against an etching solution for PEDOT films.

FIG. 4(a) is a plan view showing a front surface of the transparent conductive sheet 14 with the etching resist 15 printed thereon. FIG. 3(b) shows a part of a cross section along a line A-A in FIG. 4(a). FIG. 4(b) is a plan view showing a back surface of the transparent conductive sheet 14 with the etching resist 16 printed thereon.

As shown in FIG. 4(a), in the etching resist 15 on the front surface side of the base material, diamond-shaped electrode-forming resist portions 15a for forming sensor electrodes of the touch panel are placed in a matrix form, and the adjacent electrode-forming resist portions 15a are connected to each other in a longitudinal direction (direction Y) through thin line-forming resist portions 15b.

In contrast, as shown in FIG. 4(b), in the etching resist on the back surface side of the base material, diamond-shaped electrode-forming resist portions 16a for forming sensor electrodes of the touch panel are placed in a matrix form, and the adjacent electrode-forming resist portions 16a are connected to each other in a cross direction (direction X) through thin line-forming resist portions 16b.

As can be seen from FIGS. 4(a) and 4(b), as viewed in a thickness direction of the transparent conductive sheet 14, the electrode-forming resist portions 15a of the etching resist 15 and the electrode-forming resist portions 16a of the etching resist 16 are placed so as to fill the gaps of each other.

It is to be noted that the shapes of the etching resists 15 and 16 are not limited to the shapes described. It can be assumed that they may take various shapes.

(3) Next, as shown in FIG. 3(c), the transparent conductive sheet 14 with the etching resists 15 and 16 formed thereon is put for several minutes in a container filled with an etching solution for the transparent conductive layer. This removes the transparent conductive layers 12, 13 which are not coated with the etching resists 15 and 16. Then, the transparent conductive sheet 14 after etching is washed with water and dried.

(4) Next, as shown in FIGS. 3(d) and 5(a), a peeling film 17 is formed on the etching resist 15 and on the transparent base material 11 exposed by etching of the transparent conductive layer 12, so as to cover an area where the etching resist 15 is formed. Then, the peeling film 18 is similarly formed on the back surface side. More specifically, as shown in FIGS. 3(d) and 5(a), the peeling film 18 is formed on the etching resist 16 and on the transparent base material 11 exposed by etching of the transparent conductive layer 13, so as to cover an area where the etching resist 16 is formed.

For formation of the peeling films 17 and 18, an UV ink made by Jujo Chemical Co., Ltd, which is the same as the ink used for forming the etching resists 15 and 16, is printed by screen printing, and then the printed ink is cured by irradiation with an ultraviolet ray.

FIGS. 5(a) and 5(b) show plan views of a front surface and a back surface of the transparent conductive sheet 14 with the peeling films 17 and 18 formed thereon, respectively. It is to be noted that FIG. 3(d) shows a part of a cross section along a line A-A in FIG. 5(a). As shown in FIGS. 5(a) and 5(b), the peeling films 17 and 18 are formed so as to coat the entire areas where the etching resists 15 and 16 are formed in order to enhance the easiness of peeling.

(5) Next, as shown in FIG. 3(e), the peeling film 17 is peeled off together with the etching resist 15. Then, the peeling film 18 is peeled off together with the etching resist 16. As a result, transparent conductive patterns 19 and 20 are formed on the transparent conductive layers 12 and 13 processed according to the shapes of the etching resists 15 and 16.

FIG. 6(a) is a plan view of the front side of the transparent touch panel, while FIG. 6(b) is a plan view of the back side of the transparent touch panel. As can be seen from FIGS. 6(a) and 6(b), the transparent conductive pattern 19 has a configuration in which adjacent transparent electrode portions 19a are connected to each other in a longitudinal direction via transparent thin-line portions 19b, while the transparent conductive pattern 20 has a configuration in which adjacent transparent electrode portions 20a are connected to each other in a cross direction via transparent thin-line portions 20b.

A description is now given of the result of an examination on peelability of the etching resist. In order to examine the peelability of the etching resist, three samples (No. 1 to 3) different in thickness of the peeling film were fabricated. The thickness of the peeling film was adjusted by increasing or decreasing the number of printing times. It is to be noted that the thickness of the peeling film can also be adjusted by changing the thickness of a printing plate for screen printing.

The ultraviolet ray irradiation condition for curing the etching resist and the peeling film was the same in all the samples. A sample (No. 4) without formation of the peeling film was fabricated for comparison.

The thickness of the peeling film and the result of the examination for each sample are shown in Table 1. The thickness of the peeling film in Table 1 is the thickness of a portion coated with the etching resist ("t" in FIG. 3(d)).

TABLE 1

| Sample No. | Thickness of etching resist | Thickness of peeling film | Result of peelability check |
|---|---|---|---|
| 1 | 12 μm | 11 μm | OK |
| 2 | 12 μm | 22 μm | OK |
| 3 | 12 μm | 31 μm | OK |
| 4 | 12 μm | N/A | NG |

As shown in Table 1, in all the samples No. 1 to 3, the etching resist could be peeled off together with the peeling film. No resist residue was found on the surface after peeling. Damages such as scratches were not found on the transparent conductive pattern even with a relatively low surface hardness.

It was also found out that there is a tendency that a thicker peeling film has a larger film strength and elasticity and thereby enhances the easiness of peeling.

In contrast, as for the sample No. 4 without formation of the peeling film, peeling of the etching resist was tried along the longitudinal direction (in the case of FIG. 4(a)) or in the cross direction (in the case of FIG. 4(b)) with tweezers. However, it was impossible to peel off the entire part of the etching resist without causing a resist residue and scratches. Particularly in the thin line-forming resist portions 15b (16b), the etching resist was easily torn to pieces. During removal of a residual etching resist in the thin line-forming resist portions 15b (16b), the transparent conductive pattern was damaged, which resulted in disconnection in some cases.

(6) After the etching resist is removed, a lead-out wire 21 is formed, as shown in FIG. 6(a), on the front surface of the transparent base material 11 for electrically connecting the transparent conductive pattern 19 (transparent electrode portions 19a) to an external board (not shown). More specifically, the lead-out wire 21 is formed by printing a conductive paste by screen printing and then drying or heat-curing the printed paste. The conductive paste is a mixture of conductive powder and binders. Here, a conductive paste containing Ag powder is used for reducing wiring resistance.

Similarly, as shown in FIG. 6(b), a lead-out wire 22 is formed on the back surface of the transparent base material 11 for electrically connecting the transparent conductive pattern 20 (transparent electrode portions 20a) to an external board.

It is to be noted that the external board connected to the transparent touch panel via the lead-out wires 21 and 22 includes an IC tip mounted thereon. The IC chip detects a change in electrostatic capacity between the transparent electrode portion 19a and the transparent electrode portion 20a, and compares the detected change with a specified threshold to specify the position of a finger or the like when the finger or the like is in vicinity of or in contact with the touch panel.

Through the aforementioned steps, as shown in FIGS. 6(a) and 6(b), the capacitance-operated transparent touch panel having the transparent conductive patterns 19, 20 and the lead-out wire 21 is fabricated.

According to the method for manufacturing the transparent touch panel in the present embodiment described above, peeling the peeling films 17 and 18 achieves peeling of the entire etching resists 15 and 16 reliably and easily. This eliminates potential damages, such as disconnection and the like, on the transparent conductive patterns 19 and 20 caused by peeling jigs, and so the yield of the transparent touch panel is enhanced.

Since a resist residue is not generated, a problem of the edges at the transparent electrode portions 19a and 20a in the transparent touch panel adversely standing out due to irregular reflection of light caused by the resist residue can be avoided.

Further, according to the method for manufacturing the transparent touch panel in the present embodiment, the peeling films 17 and 18 may function as an overcoat of the transparent conductive patterns 19 and 20 until the lead-out wires 21 and 22 are formed. This makes it possible to enhance the yield of the transparent touch panel.

Moreover, since chemical and physical damages onto the transparent conductive layer as well as a resist residue are suppressed as much as possible, it becomes possible to manufacture transparent touch panels excellent in optical properties, such as transmittance and haze.

It is to be noted that the transparent conductive sheet 14 having the transparent conductive layers 12 and 13 on both sides of the transparent base material 11 may also be formed by bonding two single-sided base materials which have a transparent conductive layer formed on one surface thereof. More specifically, the transparent conductive sheet 14 may be formed from a first transparent conductive sheet having a first transparent base material and a first transparent conductive layer formed to be a transparent conductive layer 12 on one surface of the first transparent base material, and a second transparent conductive sheet having a second transparent base material and a second transparent conductive layer formed to be a transparent conductive layer 13 on one surface of the second transparent base material. The first transparent conductive sheet and the second transparent conductive sheet may be bonded together by OCA (Optical Clear Adhesive) and the like so that the other surfaces of the first and second transparent base materials are made to face each other and thereby the first and second transparent base materials constitute the transparent base material 11.

Before the first and second transparent conductive sheets are bonded, the transparent conductive layer may be patterned. More specifically, the transparent conductive patterns 19 and 20 are formed by patterning the transparent conductive layers on each of the aforementioned first and second transparent conductive sheets. Then, the first transparent conductive sheet and the second transparent conductive sheet having the transparent conductive layers processed into specified patterns may be bonded together by OCA (Optical Clear Adhesive) and the like. The bonding method is not limited to the one making the other surfaces (the surfaces without the transparent conductive patterns formed thereon) of the first and second transparent base materials face each other. One surfaces (the surfaces with the transparent conductive patterns formed thereon) of the first and second transparent base materials may face each other, and the other surface of the first transparent base material may face the one surface of the second transparent base material. Two transparent conductive sheets need to be bonded in such a way that the transparent conductive pattern on the first transparent conductive sheet does not come into contact with the transparent conductive pattern on the second transparent conductive sheet.

It is also possible to fabricate a transparent touch panel with a transparent conductive sheet having a transparent conductive layer formed only on one side of the transparent base material. In other words, both the transparent conductive pattern 19 and the transparent conductive pattern 20 may be formed on one surface of the transparent base material 11. In that case, either one of the transparent conductive pattern 19 and the transparent conductive pattern 20 is formed to have both the above-mentioned transparent electrode portions and transparent thin-line portions, while the other pattern is formed to have only the transparent electrode portions. The transparent thin-line portions of the other pattern are formed on small pieces of an insulator (insulating member) provided across the transparent thin-line portions of one pattern in order to connect (jumper-connect) the transparent electrode portions of the other pattern to each other. Thus, using a so-called single-sided triple-layer structure (or single-sided jumper structure) makes it possible to form transparent conductive patterns in the direction X and the direction Y on one side of the transparent base material 11. It is to be noted that the outlined manufacturing steps of the transparent touch panel in this case are as shown below.

(1) A transparent conductive sheet having a transparent base material and a transparent conductive layer formed on one surface of the transparent base material is prepared.

(2) Next, a first etching resist and a second etching resist are formed on the transparent conductive layer while the etching resists are separated from each other. The first etching resist corresponds to the electrode-forming resist portions 15a and the thin line-forming resist portions 15b. More specifically, the first etching resist has a plurality of first electrode-forming resist portions placed in a matrix form and thin line-forming resist portions which connect the first electrode-forming resist portions adjacent in the direction Y (or direction X) to each other. On the other hand, the second etching resist corresponds to the electrode-forming resist portions 16a. More specifically, the second etching resist has a plurality of second electrode-forming resist portions placed in a matrix form so as to form a checkered pattern with the first electrode-forming resist portions.

(3) Next, the transparent conductive layer is etched with the first etching resist and the second etching resist as a mask.

(4) Then, a peeling film is formed on the first and second etching resists and on the transparent base material exposed by etching of the first and second transparent conductive layers so as to cover an area where the first and second etching resists are formed.

(5) Next, the peeling film is peeled off with the first and second etching resists to form first and second transparent conductive patterns. The first transparent conductive pattern corresponds to the transparent electrode portions 19a and the transparent thin-line portions 19b. More specifically, the first transparent conductive pattern has a plurality of first transparent electrode portions placed in a matrix form, and first transparent thin-line portions which electrically connect the first transparent electrode portions adjacent in the direction Y (or direction X) to each other. On the other hand, the second transparent conductive pattern corresponds to the transparent electrode portions 20a. More specifically, the second transparent conductive pattern has a plurality of second transparent electrode portions placed in a matrix form so as to form a checkered pattern with the first transparent electrode portions.

(6) Next, an insulating member is formed across the first transparent thin-line portions of the first transparent conductive pattern. On the insulating member, second transparent thin-line portions (jumpers) are formed which electrically connect the second transparent electrode portions of the second transparent conductive pattern adjacent in the direction X (or direction Y) to each other.

Through the above steps, the transparent conductive patterns in the direction X and the direction Y can be formed on one side of the transparent base material.

A description is now given of some modifications.

Figure 4:
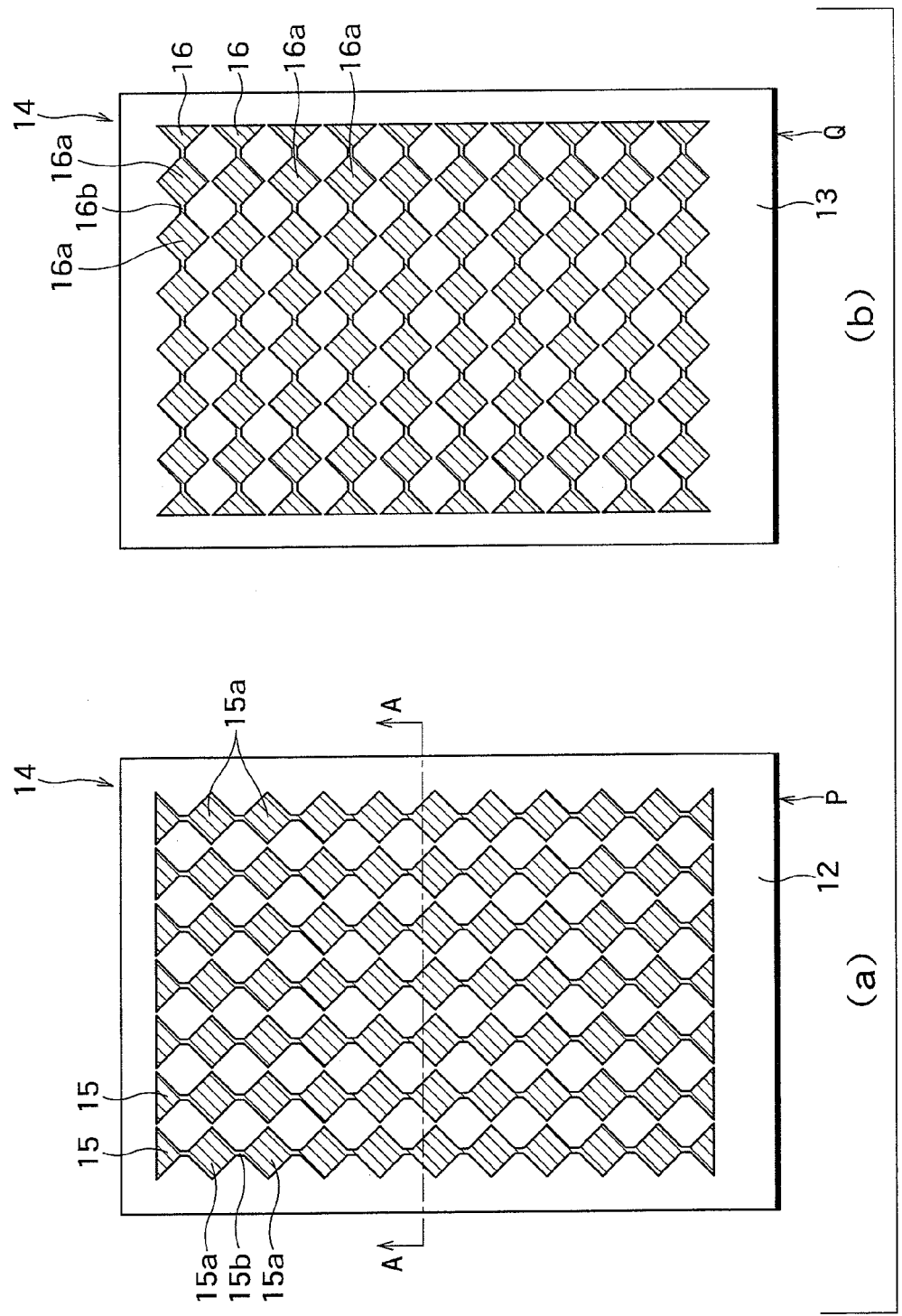
Figure 5:
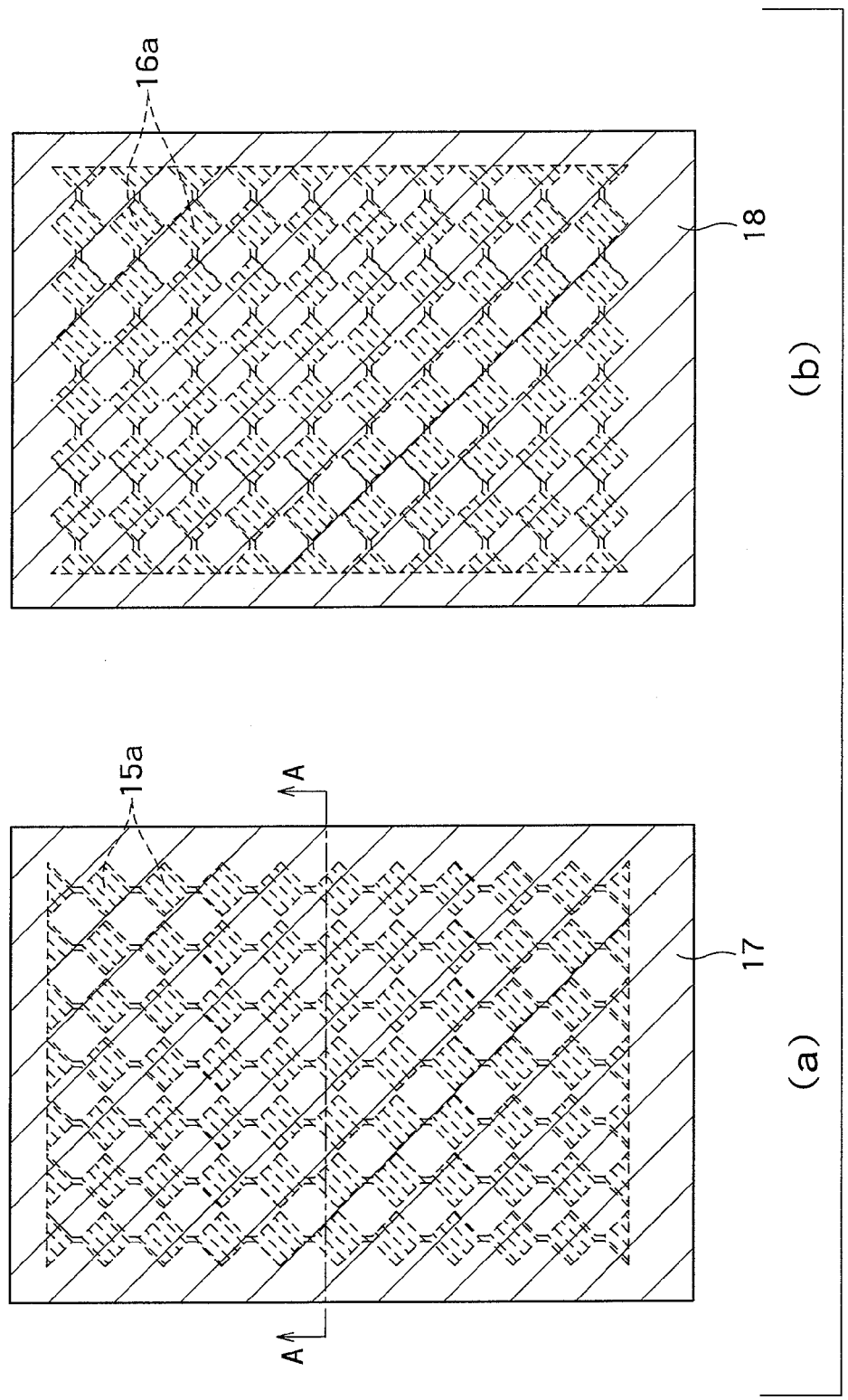
Figure 6:
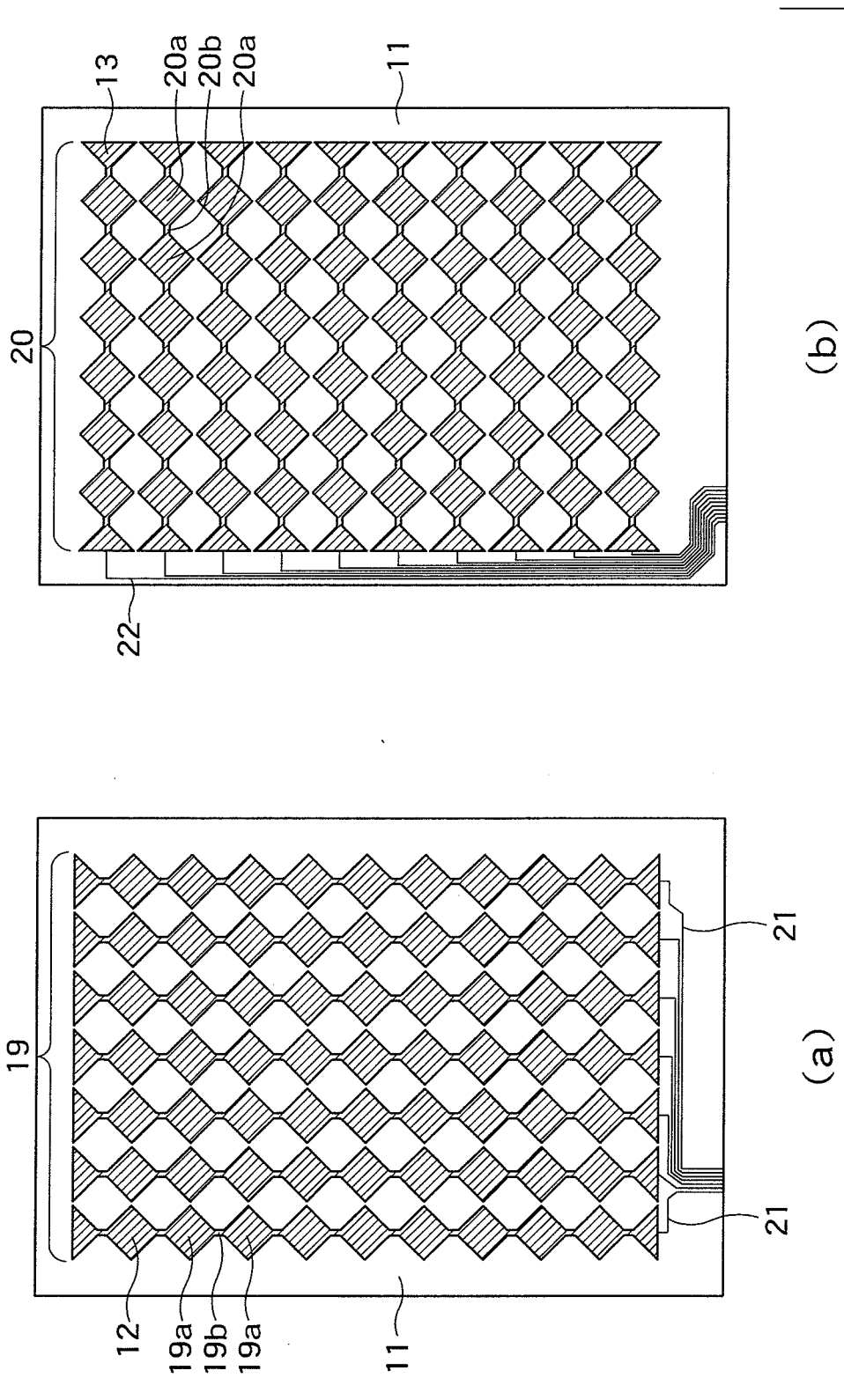

Before the peeling film 17 (18) is formed, weak releasing treatment may be applied to a peeling start region on the transparent base material 11. The peeling start region is a region where the peeling film 17 (18) is started to be peeled off. For example, a side "P" (Q) of a square shown in FIG. 4 is the peeling start region. In the weak releasing treatment, a proper quantity of silicon-based release agent is applied to the peeling start region in one example. Applying the release agent may be replaced with sticking a seal piece with weak adherence on the peeling start region. Since it is easy to peel the peeling film 17 (18) in the area subjected to such a weak releasing treatment, peeling the peeling film 5 from the peeling start region can further enhance the easiness of peeling.

Figure 7:
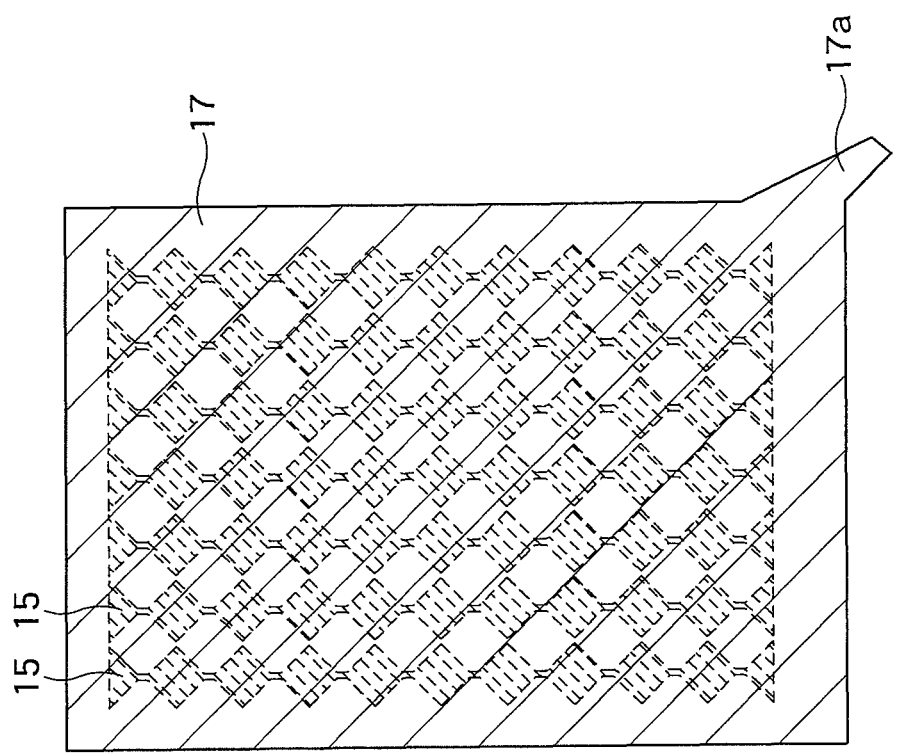
FIG. 7 is a plan view of a base material on which a peeling film having a tab portion is formed.

As shown in FIG. 7, the peeling film 17 may also be formed to have a tab portion 17a that is grabbed so as to lift the peeling film 17 when peeling is started. Accordingly, it becomes possible to grab the tab portion 17a to lift the peeling film 17, and to peel off the peeling film 17 while the tab portion 17a is being grabbed. As a consequence, the easiness of peeling can be enhanced compared with the case where peeling is conducted from the peeling start regions "P" and "Q" of the peeling film 17. It is to be noted that the above-mentioned weak releasing treatment may be applied to an area where the tab portion 17a is formed in order to further facilitate peeling from the tab portion 17a.

Figure 8:
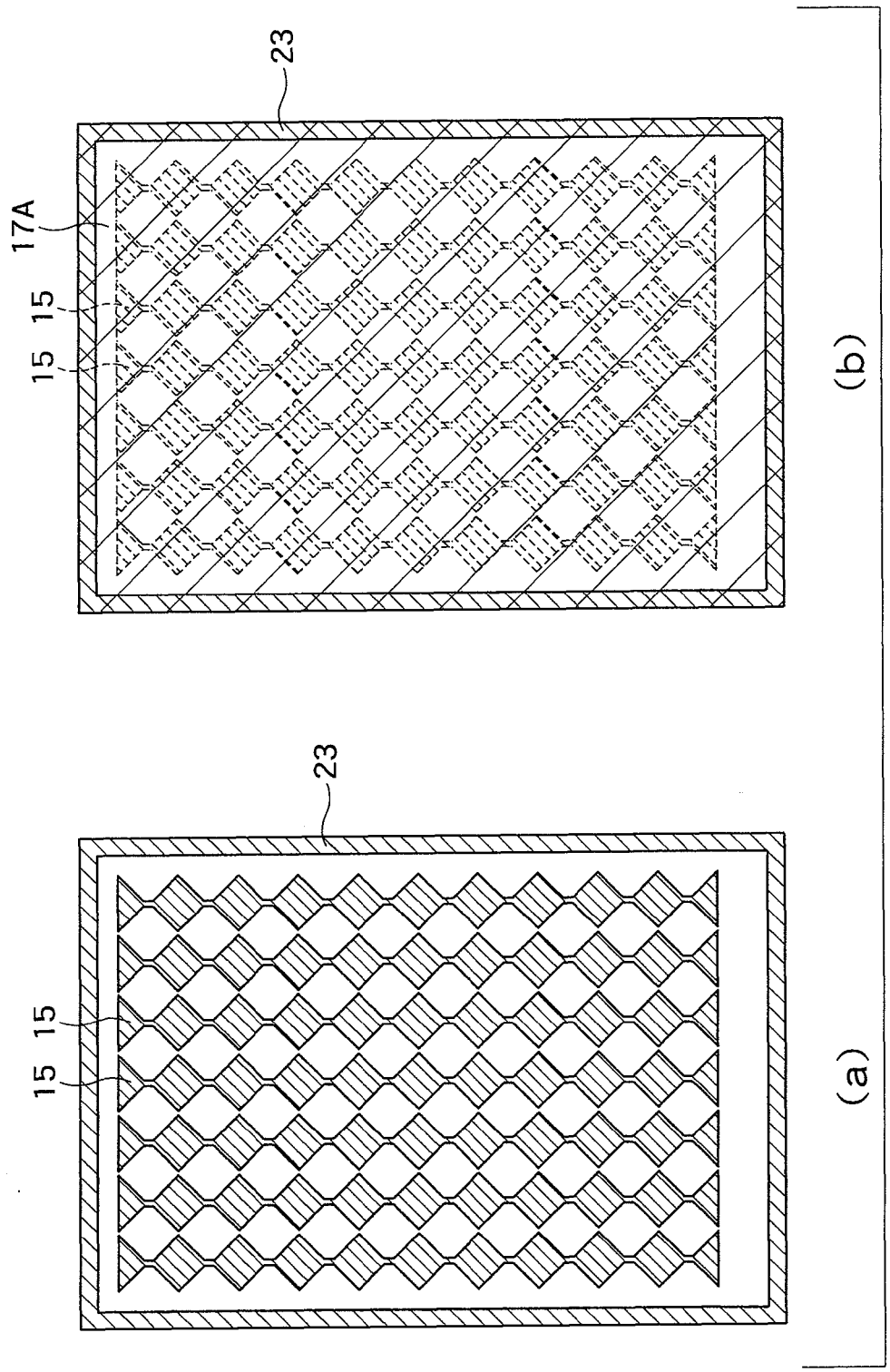
FIG. 8 is a plan view of a base material on which a peeling film having a frame portion is formed.

In the step of forming the etching resist, a frame portion for reinforcing the peeling film may also be formed. More specifically, in the step of forming the etching resist, an UV ink and the like are printed and cured on the transparent conductive layer, so that a frame portion 23 which encloses the etching resist 15 is formed together with the etching resist 15 as shown in FIG. 8(a). It is to be noted that the frame portion 23 may be formed by printing heat-curable or heat-drying inks. Preferably, the frame portion 23 is formed together with the etching resist 15 in the printing step by screen printing and the like. After the transparent conductive layer is etched, an UV ink is printed and cured on the frame portion 23 and on the area enclosed with the frame portion 23 as shown in FIG. 8(b), so that a peeling film 17A is formed. The peeling film 17A may be formed by printing heat-curable or heat-drying inks. The thus-formed peeling film 17A has a large film thickness in the part where the frame portion 23 is formed and has a reinforced peripheral portion. This makes it possible to suppress occurrence of failures such as break of the peeling film 17A at the time of peeling.

In the above description of the method for manufacturing the transparent touch panel, the lead-out wires 21 and 22 are formed after the peeling films 17 and 18 have been peeled off and the transparent conductive patterns 19 and 20 are formed. However, the lead-out wires 21 and 22 may be formed on the transparent conductive layers 12, 13 before the etching resists 15 and 16 are formed. In that case, after the lead-out wires 21 and 22 are formed, the etching resists 15 and 16 are formed and subjected to etching. The peeling films 17 and 18 are then formed so as to cover not only the etching resists 15 and 16 but also the lead-out wires 21 and 22.

Accordingly, the peeling films 17 and 18 can function not only as the overcoat of the transparent conductive patterns 19 and 20 but also as the overcoat of the lead-out wires 21 and 22. Further, since all the wiring patterns have been formed at the time when the peeling film is formed, peeling of the peeling film may be performed when the transparent touch panel is shipped or when the transparent touch panel is used by customers. In this way, the peeling film may function as an overcoat for a longer time.

It should be noted that the method for manufacturing the transparent printed circuit according to the present invention can be applied not only to manufacturing of transparent touch panels but also to manufacturing of other arbitrary transparent printed circuits such as transparent FPCs.

Based on the aforementioned description, those skilled in the art may conceive additional effects and various arrangements of the present invention. However, the aspect of the present invention is not limited to the embodiment disclosed. It should be understood that various additions, modifications, and partial deletion of the present invention are possible without departing from the conceptual spirit and meaning of the present invention which are derived from the scope prescribed by the claims and the equivalency thereof.

REFERENCE SIGNS LIST 1, 11 Transparent base material
2, 12, 13 Transparent conductive layer
3, 14 Transparent conductive sheet
4, 15, 16 Etching resist
5, 17, 17A, 18 Peeling film
6, 19, 20 Transparent conductive pattern
15a, 16a Electrode-forming resist portion
15b, 16b Thin line-forming resist portion
17a Tab portion
19a, 20a Transparent electrode portion
19b, 20b Transparent thin-line portion
21, 22 Lead-out wire
23 Frame portion
P, Q Peeling start region

The invention claimed is:

1. A manufacturing method for a transparent printed circuit, comprising:
    providing a transparent conductive sheet having a transparent base material and a transparent conductive layer formed on the transparent base material;
    forming, by screen printing, an etching resist having a specified pattern on the transparent conductive layer;
    etching the transparent conductive layer with the etching resist as a mask;
    forming, by screen printing, a peeling film on the etching resist and on the transparent base material exposed by the etching of the transparent conductive layer so as to cover an area where the etching resist is formed, the peeling film consisting of a material identical to the material of the etching resist; and
    peeling the peeling film together with the etching resist.

2. The manufacturing method for the transparent printed circuit according to claim 1, wherein the transparent conductive layer contains an organic transparent conductive polymer.

3. The manufacturing method for the transparent printed circuit according to claim 2, wherein the organic transparent conductive polymer is polyethylene dioxythiophene, polypyrrole, or polyaniline.

4. The manufacturing method for the transparent printed circuit according to claim 1, wherein the transparent conductive layer contains a metal nanowire.

5. The manufacturing method for the transparent printed circuit according to claim 4, wherein the metal nanowire is made of at least one or more kinds of metals out of iron, cobalt, nickel, copper, zinc, ruthenium, rhodium, palladium, silver, cadmium, osmium, iridium, platinum and gold, or an alloy having the metals as main components and an additive element added thereto.

6. The manufacturing method for the transparent printed circuit according to claim 1, wherein
the etching resist and the peeling film are formed by:
printing an UV ink curable by ultraviolet irradiation; and irradiating the printed UV ink with an ultraviolet ray so that the ink is cured.

7. The manufacturing method for the transparent printed circuit according to claim 1, wherein
the etching resist and the peeling film are formed by:
printing a heat curable ink; and heating the printed ink so that the ink is cured.

8. The manufacturing method for the transparent printed circuit according to claim 1, wherein
the etching resist and the peeling film are formed by:
printing a heat-drying ink; and drying the printed ink.

9. The manufacturing method for the transparent printed circuit according to claim 1, wherein, before the peeling film is formed, weak releasing treatment that enhances releasability between the transparent base material and the peeling film is applied to a peeling start region from which the peeling film is started to be peeled off.

10. The manufacturing method for the transparent printed circuit according to claim 1, wherein the peeling film is formed to have a tab portion that is grabbed to lift the peeling film when peeling is started.

11. The manufacturing method for the transparent printed circuit according to claim 1, wherein
before the etching resist is formed, a conductive wiring is formed on the transparent conductive layer, and
the peeling film is formed so as to coat the conductive wiring.

12. The manufacturing method for the transparent printed circuit according to claim 1, wherein the transparent base material is made of polyethylene terephthalate, polyethylene naphthalate, polycarbonate, transparent polyimide, or a glass film having flexibility.

13. A manufacturing method for a transparent touch panel, comprising:
providing a transparent conductive sheet having a transparent base material, and a first transparent conductive layer and a second transparent conductive layer which are respectively formed on a front surface and a back surface of the transparent base material;
forming, by screen printing, a first etching resist having a specified pattern on the first transparent conductive layer;
forming, by screen printing, a second etching resist having a specified pattern on the second transparent conductive layer;
etching the first transparent conductive layer with the first etching resist as a mask while etching the second transparent conductive layer with the second etching resist as a mask;
forming, by screen printing, a first peeling film on the first etching resist and on the transparent base material exposed by the etching of the first transparent conductive layer so as to cover an area where the first etching resist is formed, the first peeling film consisting of a material identical to the material of the first etching resist;
forming, by screen printing, a second peeling film on the second etching resist and on the transparent base material exposed by the etching of the second transparent conductive layer so as to cover an area where the second etching resist is formed, the second peeling film consisting of a material identical to the material of the second etching resist;
peeling the first peeling film together with the first etching resist to form a first transparent conductive pattern; and
peeling the second peeling film together with the second etching resist to form a second transparent conductive pattern.

14. A manufacturing method for a transparent touch panel, comprising:
providing a transparent conductive sheet having a transparent base material and a transparent conductive layer formed on one surface of the transparent base material;
forming on the transparent conductive layer a first etching resist having a plurality of first electrode-forming resist portions and thin line-forming resist portions that connect the first electrode-forming resist portions adjacent in a first direction to each other, and a second etching resist having a plurality of second electrode-forming resist portions, the first etching resist and the second etching resist being formed by screen printing;
etching the transparent conductive layer with the first etching resist and the second etching resist as a mask;
forming, by screen printing, a peeling film on the first and second etching resists and on the transparent base material exposed by the etching of the first and second transparent conductive layers so as to cover an area where the first and second etching resists are formed, the peeling film consisting of a material identical to the material of the first and the second etching resist;
peeling the peeling film together with the first and second etching resists to form a first transparent conductive pattern having a plurality of first transparent electrode portions and first transparent thin-line portions that electrically connect the first transparent electrode portions adjacent in the first direction to each other, and a second transparent conductive pattern having a plurality of second transparent electrode portions; and
forming an insulating member across the first transparent thin-line portion of the first transparent conductive pattern and forming on the insulating member second transparent thin-line portion that electrically connects the second transparent electrode portions of the second transparent conductive pattern adjacent in a second direction to each other.

15. A manufacturing method for a transparent touch panel, comprising:
providing a first transparent conductive sheet having a first transparent base material and a first transparent conductive layer formed on one surface of the first transparent base material, and a second transparent conductive sheet having a second transparent base material and a second transparent conductive layer formed on one surface of the second transparent base material;
forming, by screen printing, a first etching resist having a specified pattern on the first transparent conductive layer;
forming, by screen printing, a second etching resist having a specified pattern on the second transparent conductive layer;
etching the first transparent conductive layer with the first etching resist as a mask;
etching the second transparent conductive layer with the second etching resist as a mask;
forming, by screen printing, a first peeling film on the first etching resist and on the transparent base material exposed by the etching of the first transparent conductive layer so as to cover an area where the first etching resist is formed, the first peeling film consisting of a material identical to the material of the first etching resist;

forming, by screen printing, a second peeling film on the second etching resist and on the transparent base material exposed by the etching of the second transparent conductive layer so as to cover an area where the second etching resist is formed, the second peeling film consisting of a material identical to the material of the second etching resist;

peeling the first peeling film together with the first etching resist to form a first transparent conductive pattern;

peeling the second peeling film together with the second etching resist to form a second transparent conductive pattern; and bonding the first transparent conductive sheet having the first transparent conductive pattern formed thereon to the second transparent conductive sheet having the second transparent conductive pattern formed thereon.

16. A manufacturing method for a transparent printed circuit, comprising:

providing a transparent conductive sheet having a transparent base material and a transparent conductive layer formed on the transparent base material;

forming, by screen printing, an etching resist having a specified pattern on the transparent conductive layer;

etching the transparent conductive layer with the etching resist as a mask;

forming, by screen printing, a peeling film on the etching resist and on the transparent base material exposed by the etching of the transparent conductive layer so as to cover an area where the etching resist is formed, the peeling film consisting of a material identical to the material of the etching resist; and peeling the peeling film together with the etching resist, wherein the peeling film is formed by:

printing an ink on the transparent conductive layer, in the forming of the etching resist, so that a frame portion that encloses the etching resist is formed; and printing and curing the ink on the frame portion and on an area enclosed with the frame portion after the transparent conductive layer is etched.

* * * * *